United States Patent
Cotte

(10) Patent No.: US 11,132,082 B2
(45) Date of Patent: Sep. 28, 2021

(54) MULTIFUNCTIONAL DISPLAY

(71) Applicant: PA.COTTE FAMILY HOLDING GMBH, Amberg (DE)

(72) Inventor: Pierre-Alain Cotte, Amberg (DE)

(73) Assignee: PA.COTTE FAMILY HOLDING GMBH, Amberg (DE)

( * ) Notice: Subject to any disclaimer, the term of this patent is extended or adjusted under 35 U.S.C. 154(b) by 0 days.

(21) Appl. No.: 17/263,520

(22) PCT Filed: Jul. 12, 2019

(86) PCT No.: PCT/EP2019/068834
§ 371 (c)(1),
(2) Date: Jan. 26, 2021

(87) PCT Pub. No.: WO2020/020669
PCT Pub. Date: Jan. 30, 2020

(65) Prior Publication Data
US 2021/0232244 A1 Jul. 29, 2021

(30) Foreign Application Priority Data
Jul. 26, 2018 (EP) .................................... 18185693

(51) Int. Cl.
*G06F 3/042* (2006.01)
*G06F 3/041* (2006.01)
(Continued)

(52) U.S. Cl.
CPC ........ *G06F 3/0412* (2013.01); *G06F 3/03547* (2013.01); *G06F 3/042* (2013.01);
(Continued)

(58) Field of Classification Search
CPC .............. H01L 27/3234; H04N 1/0284; H04N 21/42224; H04N 2005/443;
(Continued)

(56) References Cited

U.S. PATENT DOCUMENTS 5,818,976 A * 10/1998 Pasco ................. H04N 1/00718
382/289
9,951,935 B2    4/2018 Cotte
(Continued)

FOREIGN PATENT DOCUMENTS

WO     2020/020669 A1    1/2020

OTHER PUBLICATIONS

European Patent Office/ISA, International Search Report and Written Opinion for PCT Application No. PCT/EP2019/068834, dated Sep. 25, 2019.
(Continued)

*Primary Examiner* — Julie Anne Watko
(74) *Attorney, Agent, or Firm* — SoCal IP Law Group LLP; Angelo Gaz

(57) ABSTRACT

A multifunctional display including a display panel and a sensing and emitting base, the display panel comprising a body between a viewing surface, and a base surface, and a plurality of optical paths within the body for the passage of light between base orifice and the viewing orifice, the sensing and emitting base comprising at least one multi-color light source below or in the base orifice and at least one optical sensor below or in the base orifice. The multifunctional display may scan a surface of an object by emitting light from the multi-color light source and simultaneously detecting with the optical sensor the reflected light from said surface placed on the viewing surface; and computing with a microprocessor, an image of said surface based on the detected reflected light of a plurality of optical paths.

15 Claims, 3 Drawing Sheets

(51) Int. Cl.
*H01L 27/32*      (2006.01)
*G06F 3/01*       (2006.01)
*G06F 3/044*      (2006.01)
*G06F 3/0354*     (2013.01)
*G06F 3/03*       (2006.01)
*H04N 1/028*      (2006.01)

(52) U.S. Cl.
CPC ........ G06F 3/0416 (2013.01); H01L 27/3234 (2013.01); *G06F 3/016* (2013.01); *G06F 3/044* (2013.01); *G06F 3/0414* (2013.01); *H04N 1/0284* (2013.01)

(58) Field of Classification Search
CPC ...... G06F 3/03547; G06F 3/042; G06F 3/016; G06F 3/0416; G06F 3/0412; G06F 3/0414
See application file for complete search history.

(56) References Cited

U.S. PATENT DOCUMENTS

| | | | |
|---|---|---|---|
| 2017/0220838 A1* | 8/2017 | He | G06F 3/044 |
| 2017/0220844 A1 | 8/2017 | Jones et al. | |
| 2017/0337412 A1 | 11/2017 | Bhat et al. | |
| 2019/0012512 A1* | 1/2019 | He | G06K 9/0004 |
| 2019/0034020 A1* | 1/2019 | He | G06K 9/00033 |
| 2020/0067021 A1* | 2/2020 | Cotte | H01L 51/5237 |

OTHER PUBLICATIONS

European Patent Office, Decision to Grant for European Patent Application No. 18185693.1, dated Jul. 23, 2020.

\* cited by examiner

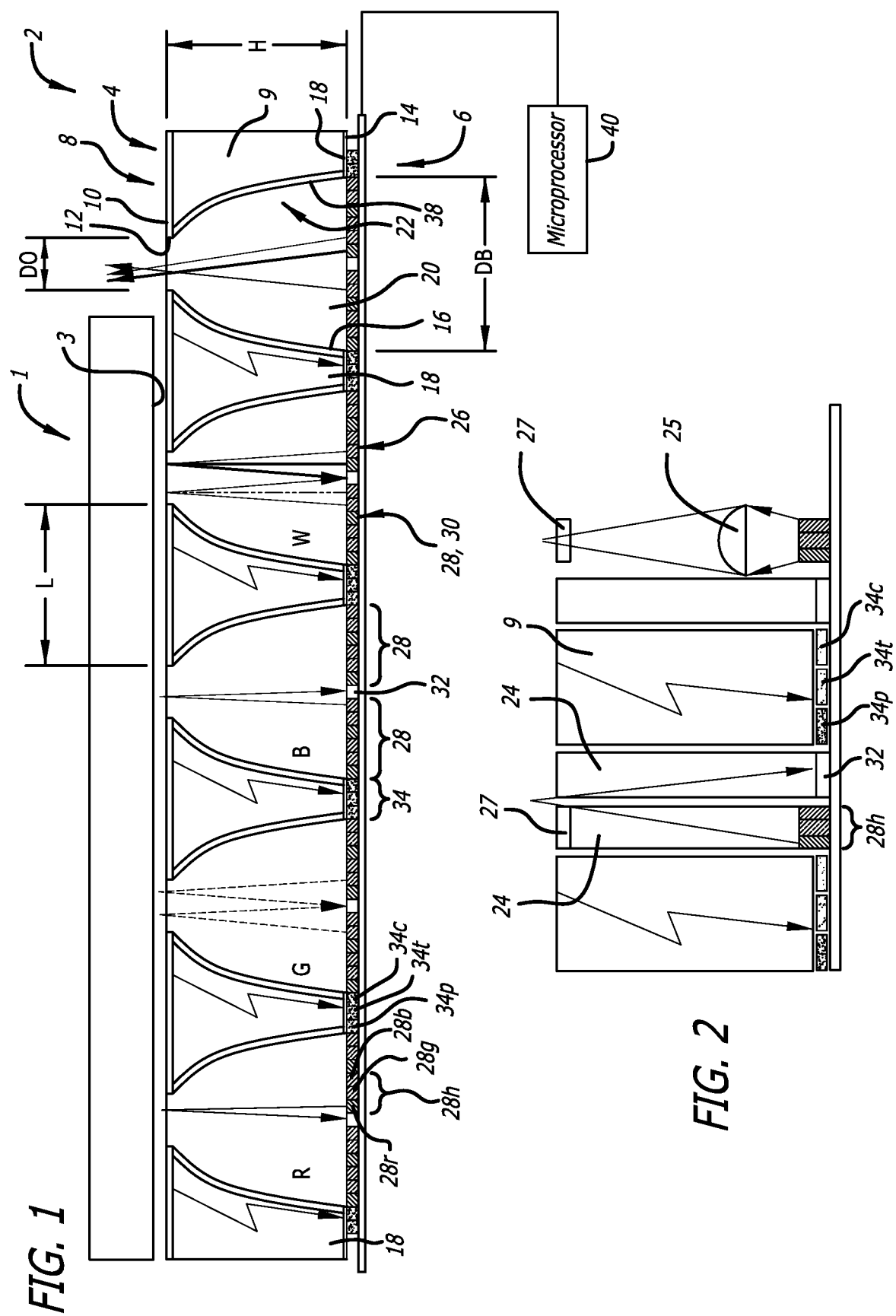

MULTIFUNCTIONAL DISPLAY

RELATED APPLICATION INFORMATION

This patent claims priority from International PCT Patent Application No. PCT/EP2019/068834, filed Jul. 12, 2019 entitled, "MULTIFUNCTIONAL DISPLAY", which claims priority to European Patent Application No. EP18185693.1, filed Jul. 26, 2018 all of which are incorporated herein by reference in their entirety.

FIELD OF THE INVENTION

The present invention relates to a multifunctional display for displaying still or moving images and for sensing and processing external signals and information. The invention in particular relates to a display with invisible holes and a substantially light resistant material forming an outer surface of the display, light being emitted through the invisible holes forming pixels of an image to be displayed.

BACKGROUND

A display comprising a light resistant material such as metal or other substantially non transparent material comprising a display panel with holes formed therein between a substrate on which light sources are arranged and display emitting surface where the light exits the display is described in U.S. Pat. No. 9,951,935. A display according to the aforementioned document comprises optical paths that extend through the display panel from a substrate that may comprise light sources such as LEDs or OLEDs to the holes formed at the viewing surface. The optical paths extending from the light source to the exit orifice have a generally tapered or decreasing diameter shape that exits at the displace surface from which an image can be viewed by an observer. The display panel may be in a substantially opaque solid material such as in a metal, ceramic, plastic, semiconductor or composite material that may be formed either by subtractive methods such as laser forming of the holes in a panel or by additive methods such as material deposition methods. The exit orifices have a diameter preferably less than 25 µm such that at a normal viewing distance for an observer of the displayed image, the holes are too small to be seen by the naked human eye. The holes may be spaced apart at distances over around 40 µm to 200 µm, the distance however depending on the number of pixels that are desired per surface area of the display, in other words depending on the desired resolution of the display. Since the pixels of a still or moving image are formed by a light emitted through holes that are invisible to a viewer formed at the surface of a material layer that may be opaque, various materials may be used for the display panel. Also, the surface area between the light emitting orifices may be provided with functional elements such as photovoltaic elements as described in the aforementioned document U.S. Pat. No. 9,951,935. Moreover, the appearance of the viewing surface can be adapted according to various functional or aesthetic reasons in view of the ability to provide the viewing surface with a large range of materials having various properties.

Nevertheless, despite the various advantages of a display as described in the aforementioned patent U.S. Pat. No. 9,951,935, in view of the ubiquity of display devices in many applications having a graphical user interface, it would be advantageous to enhance the functionalities of the display, in particular as concerns enhancing the capabilities of the display for receiving and processing external information or commands.

SUMMARY OF THE INVENTION

In view of the foregoing, it is an object of the invention to provide a display having the advantages of the display of the aforementioned type with invisible holes, capable not only of displaying a still or moving image with high resolution, but also capable of enhanced functionalities for receiving and processing information external to the display.

It would be advantageous to provide a display with enhanced functionalities that has low power consumption.

It would be advantageous to provide a display with enhanced functionalities that is versatile.

It is advantageous to provide a display with enhanced functionalities that is robust.

It is advantageous to provide a display with enhanced functionalities that is economical to manufacture in high series production.

It is advantageous to provide a display with enhanced functionalities that may be integrated into many different applications and devices with a great versatility in form and function.

For certain applications, one of the specific aims of the present invention is to provide a display that is able to receive and process optical signals from the display's environment, in particular to perform a scan of objects in contact with or in proximity to the viewing surface.

It would be advantageous to provide a display with scanning capabilities that is very accurate and in particular that has high contrast and low power consumption.

It would be advantageous to provide a display with enhanced functionalities that is capable of sensing objects such as a user's finger and to receive commands based thereon.

It would be advantageous to provide a display with an enhanced functionalities including sensing the contact of objects on the display and capable of discriminating various characteristics of the object in order to either determine properties of the object or to receive and process commands.

It would be advantageous to provide a display with an enhanced functionalities including biometric identification.

Objects of the invention have been achieved by providing a display as set forth herein.

Disclosed herein is a multifunctional display including a display panel and a sensing and emitting base, the display panel comprising a body forming a layer extending substantially between a viewing surface that an observer can see, or against which an object may be placed, and a base surface facing the sensing and emitting base, and a plurality of optical paths bounded by a light resistant material are formed within the body extending between a base orifice in the base surface and a viewing orifice in the viewing surface for the passage of light between base orifice and the viewing orifice, the sensing and emitting base comprising at least one multi-color light source positioned below or in the base orifice and at least one optical sensor positioned below or in the base orifice.

According to a first aspect of the invention, the display comprises a scanning function in which the sensing and emitting base is operable to emit light from the multi-color light source and simultaneously detect with the optical sensor the reflected light from a surface of an object placed on the viewing surface, and to compute with a microprocessor, an image of said surface based on the detected reflected light of a plurality of optical paths.

According to a second aspect of the invention, the display comprises non-optical sensors, each arranged under a solid region of the display panel between optical paths.

In an advantageous embodiment, said image is processed as an output for a visual reproduction of the scanned surface.

In an advantageous embodiment, said image is processed as a characterization of the object, for instance for identification of the object.

In an advantageous embodiment, a diameter (DO) of the viewing orifice is in a range of 1 µm to 25 µm and the distance (L) between adjacent viewing orifices is in a range of 25 µm to 200 µm.

In an advantageous embodiment, a diameter (DB) of the base orifice is in a range of 20 inn to 150 µm.

In an advantageous embodiment, a height (H) of the body of the display panel is in a range of 20 µm to 1000 µm, more preferably in the region of 20 µm to 500 µm.

In an advantageous embodiment, each optical path and associated multi-color light source, forms in a display function of the display, a pixel of a still or moving image.

In an advantageous embodiment, in the scanning function, the sensing and emitting base is operable, for each optical path, to successively emit light from the multi-color light source at different colors and simultaneously successively detect with the optical sensor the reflected light, whereby the microprocessor computes from a combination of the successively detected reflected light, at least a color and a light intensity of the scanned surface for each optical path.

In an advantageous embodiment, the display further comprises non-optical sensors, each arranged under a solid region of the display panel between optical paths.

In an advantageous embodiment, a density and resolution of non-optical sensors corresponds to at least 10% of a density and resolution of optical paths, preferably at least 25% of the density and resolution of optical paths, more preferably at least 50% to 100% of the density and resolution of optical paths.

In an advantageous embodiment, the non-optical sensors include any one or more of a pressure sensor, a thermal sensor, a capacitive sensor, and a magnetic field sensor.

In an advantageous embodiment, the capacitive sensor comprises first and second electrodes arranged in, or substantially in, a same plane parallel to the viewing surface.

In an advantageous embodiment, the non-optical sensors comprise a piezo electric element, which can be used as a pressure sensor.

In an advantageous embodiment, the piezo-electric element may be connected to a control system arranged to activate the piezo electric element as a haptic actuator, or as a sound generator, or as a vibration generator.

In an advantageous embodiment, the non-optical sensors may be positioned on a substrate of the sensing and emitting base.

In an advantageous embodiment, the display further comprises a functional layer on the viewing surface, the functional layer comprising sensing elements and/or photovoltaic cells for transforming light received on the viewing surface into electrical energy, in particular to charge a power source of the display.

In an advantageous embodiment, the body of the display panel may be made of a light resistant material, for instance a metal or a ceramic.

In an embodiment, the body of the display panel may alternatively be made of a transparent or partially transparent material for visible and/or infrared light, whereby the optical paths comprise a light resistant boundary layer.

In an advantageous embodiment, a combination of optical and non-optical sensors are employed in a measurement of a characteristic of an object in contact with the viewing surface.

Also disclosed herein is a method of scanning a surface of an object comprising:
  a. providing a display according to descriptions herein;
  b. emitting light from the multi-color light sources and simultaneously detecting with the optical sensors the reflected light from said surface placed on the viewing surface;
  c. computing with a microprocessor, an image of said surface based on the detected reflected light of a plurality of optical paths.

In an advantageous embodiment, for each optical path, the method comprises successively emitting light from the multi-color light source at different colors and simultaneously successively detecting with the optical sensor the reflected light, whereby the microprocessor computes from a combination of the successively detected reflected light, at least a color and a light intensity of the scanned surface for each optical path.

In an advantageous embodiment, for each optical path, the method comprises emitting white light from the multi-color light source and simultaneously detecting with the optical sensor at least a color spectrum and intensity of the reflected light for each optical path.

In an advantageous embodiment, the method further comprises determining the contour of the surface in contact with the viewing surface and limiting the activation of the light sources to those that are within said contour in order to reduce power consumption.

In an advantageous embodiment, the contour is determined using the optical sensors and/or non-optical sensors of the display.

In an advantageous embodiment, the contour is detected by differentiation of relative constant ambient light, versus short pulses of the light sources synchronized with the activation and duration of the corresponding light sensors.

Further objects and advantageous features of the invention will be apparent from the claims, from the detailed description, and annexed drawings.

BRIEF DESCRIPTION OF THE DRAWINGS

FIG. 1 is a schematic cross sectional view of a portion of a display with sensing functions according to an embodiment of the invention illustrating an object placed on a viewing surface of the display, said object constituting for instance a sheet of paper;

FIG. 2 is a schematic cross sectional image of a portion of the display according to variants of the invention;

Figure 3:
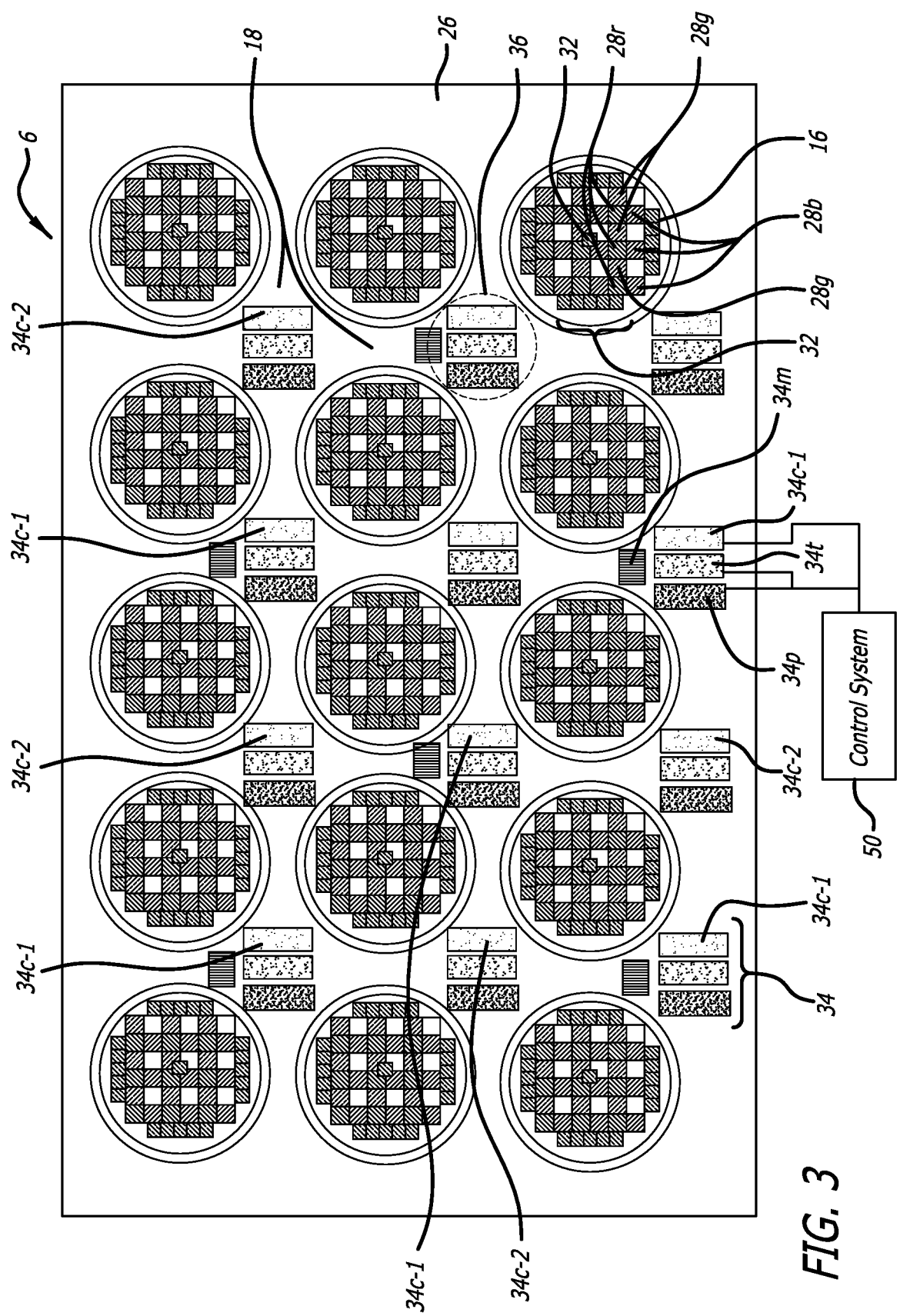
FIG. 3 is a schematic top view of a light emitting and sensing substrate of a display according to an embodiment of the invention.

The schematic illustrations are not intended to be drawn to scale and are simplified in order to better explain the features and principles of the invention, it being understood that these illustrations are not representative of actual dimensions.

DETAILED DESCRIPTION OF EMBODIMENTS OF THE INVENTION

Referring to the figures, a display 2 according to an embodiment of the invention comprises a display panel 4 and a sensing and emitting base 6. An object 1 having a surface to be detected 3 may be placed on a viewing surface 10 of the display 2.

The object 1 in the illustrated embodiment represents a cross section of a substrate such as a sheet of paper having images or text on the detected surface 3.

The detected surface 3 may be sensed or scanned by the display 2 as will be described in more detail hereinafter.

Within the scope of the invention, the object 1 may be any other type of object placed on the viewing surface, including a user's finger, which the display 2 is intended to sense.

The display panel 4 comprises a body 9 forming a layer extending substantially between the viewing surface 10 that an observer can see, or against which an object 1 may be placed, and a base surface 14 facing a sensing and emitting base 6. Optical paths 20 are formed within the body 9 and extend between the base surface 14 and the viewing surface 10, each optical path 20 forming a channel for the passage of light between a base orifice 16 of the optical path 20 and a viewing orifice 12 at the viewing surface 10.

In preferred embodiments, the optical path has a base orifice 16 with a larger surface area than the viewing orifice 12. The orifices may have a circular or generally circular shape, however within the scope of the invention, the base and viewing orifices may have different shapes such as polygonal, square, rectangular, and oval. Moreover, the viewing orifice 12 may have a shape that is different from the shape of the base orifice 16. For instance, the base orifice may be square and the viewing orifice circular.

In a preferred embodiment, the shape of the optical path 20 from the base orifice to the viewing orifice 12 has a reducing surface area or diameter, whereby the profile of the boundary wall 38 forming the optical path 20 may have a generally parabolic shape configured to concentrate the light emitted from the base towards the viewing orifice a conical shape or other profiles may however be provided within the scope of the invention.

As illustrated in FIG. 2, within the scope of the invention it is also possible to have a light guide 24 formed within the optical path between the base orifice 16 and the viewing orifice 12 for guiding light from the base to the viewing surface and vice versa.

A lens 25 may also be provided in the optical path between the base orifice and the viewing orifice.

The viewing orifices 12 may be open as illustrated in FIG. 1, namely without any filling material, however in an embodiment, each viewing orifice may also be provided with a lens or a diffuser 27 arranged to diffuse emitted or received light. In an example of a diffuser 27 as illustrated in FIG. 2, the diffuser may serve to mix the light signals of multiple sources, for instance of an RGB (red (R), green (G), blue (B)) light source 28h. Light sources 28 are a side by side pair of source 28h.

A functional layer 8 may be provided on the outer surface of the body 9 of the display panel 4, the functional layer 8 provided with various properties according to various embodiments of the invention.

In a first embodiment, the functional layer 8 comprises photovoltaic material or cells for transforming light received on the viewing surface 10 into electrical energy, in particular to charge a power source of the display. The photovoltaic layer may also be used, in substitution or in addition, as a sensor for sensing the properties of light impinging upon the viewing surface 10, which may be used for instance for detecting characteristics of the environment of the viewing orifice 12. If the display is being used in sunlight for instance, sensing of the sunlight may be used to adjust the emission intensity of the light sources 28 of the display 2.

In variants, the functional layer may comprise: conductive portions, piezo electric portions, magnetic portions, or various sensing elements for detecting contact of objects on the viewing orifice. For instance the functional layer components may be used for detection of a finger, or a pen, or a beam of light such a laser beam, or a pointing device, or any other object, and in particular for locating the specific position of the object on the viewing surface 10. Moreover, the functional layer 8 may comprise a combination of sensors and photovoltaic cells for performing multiple functions and simultaneously providing a power source for the display.

In a preferred embodiment, the diameter DO of the viewing orifice 12 is preferably in a region of 1 µm to 25 µm, more preferably 2 µm to 20 µm and the distance L between adjacent viewing orifices 12 is preferably in a range of 20 µm to 200 µm, more preferably 20 µm to 100 µm.

In a preferred embodiment, the diameter DB of the base orifice 16 is preferably in a range from 20 µm to 150 µm, more preferably 50 µm to 150 µm. The relatively large area of the base orifice 16 for the light source 28h enables a plurality of light sources and sensors to be positioned within the projected surface area of the base orifice 16.

In a preferred embodiment, the height H of the body 9 of the display panel is preferably in the region of 40 µm to 1000 µm, more preferably in the region of 40 µm to 500 µm.

Due to the small viewing orifices 12 and large distances L between the viewing orifices 12, the viewing surface 10 provides a surface area of more than 90 percent, for instance in a region of 95 percent of the total surface area of the display, available for the functional layer 8. Thus, a significant portion of the viewing surface may be used as a photovoltaic layer, optionally in conjunction with sensors for other functions. In portable displays such as found on various portable computing devices such as personal computers, smart phones or smart watches, a high autonomy of the computing device or the display may thus be achieved.

Moreover, due to the possibility of choosing a range of light resistant and in particular light absorbant materials for the panel material, or at least the viewing surface 10 thereof, the need for increasing the emission power of the light sources in situations of strong ambient lighting compared to conventional displays with glass surfaces is significantly reduced. This also participates in the low power consumption of the display according to embodiments of the invention.

The functional layer may be formed directly integrated on top of the body 9 with the orifices produced either by subtraction, for instance in a laser forming technique piercing through both the body and functional layer, or by additive manufacturing techniques depositing various layers, such as by chemical vapor deposition (CVD), sputter deposition, printing and lithographic techniques, electrochemical plating, and combinations thereof.

The body 9 may be made of a metallic material, a semiconductor material, or various amorphous or composite materials that may be opaque or partially opaque. The body 9 however may be made of a transparent material, in which case the optical path 20 may comprise a boundary layer 38 that is at least partially light resistant and optionally reflective in order to reduce or prevent light emitted at the base orifice 16 to pass into the transparent material of the body 9.

The opaque material of the body 9, or the light resistant (i.e. non transparent or partially non transparent) boundary layer 38 in a variant with a transparent or partially transparent body material, advantageously prevents optical crosstalk between adjacent optical paths 20 and associated viewing orifices 12 and between optical sensors 32 in adjacent optical paths. High contrast, resolution and color accuracy may thus be achieved while at the same time providing a large available surface area for other functions such as energy capture (PV cells) and sensing.

In an embodiment with a transparent or partially transparent material forming the body 9, light impinging on the viewing surface 10 between the viewing orifices 12, may thus be transmitted to the base surface 14. In a transparent body variant, light transmitted to the base surface 14 through the display panel may be used for sensing purposes of environmental light or for reading light signals, such as infrared signals or visible light signals, used as input commands for the display. Optical sensors may thus be arranged on the sensing and emitting base 6 in the region between base orifices 16.

The boundary layer 38 may for instance comprise a reflective metallic coating, for instance a coating of gold, platinum, silver, aluminium, and alloys thereof.

The sensing and emitting base may comprise a substrate 26 and light sources 28 on the substrate 26, the light sources 28 positioned within or below the base orifice 16 of the display panel 4.

The sensing and emitting base further comprises sensors 30 on or in the substrate 26. The sensors 30 include optical sensors 32 that are positioned in or below the base orifices 16 for receiving signals through the optical paths 20, and in advantageous embodiments, the sensors may further include non-optical sensors 34 below the solid region 18 of the body 9 disposed between the base orifices 16. It may be noted that the LEDs used for light emission may also be configured as light sensors. Moreover, in addition to non-optical sensors 34 below the solid regions, optical sensors may also be arranged in variants where the body 9 of the display panel 4 is made of a transparent or partially transparent material for visible, or infrared, or ultraviolet light.

The non-optical sensors may thus be used to capture signals transmitted between the viewing surface 10 and the base surface 14 of various natures including any one or more of electrical, thermal, mechanical and acoustic signals depending on the type of non-optical sensor.

The optical sensors 32 in a preferred embodiment include color light sensors for instance RGB (Red, Green, Blue) optical sensors, and optionally infrared sensors. Optical sensors may also include wide spectrum optical intensity sensors. The optical sensors 32 may include a plurality of detectors for different spectrums, or one or more multi-spectrum detectors as per se known in the field of optical sensors. Optical sensors that are preferred in a certain embodiments of the invention include wide spectrum luminance sensors (at least covering the RGB spectrum of, the emitting RGB light sources) or R, G and B sensors with similar RGB spectrum to the emitting RGB lighting sources, infrared sensors for ambient light as well as infrared sensors for detecting heat for instance heat from a finger.

In a preferred embodiment, there is at least one optical sensor 32, in particular a luminance or RBG sensor, preferably positioned at or proximate a center of base orifice 16.

The optical sensor 32 may comprise a light resistant separation wall therearound allowing reception of light signals from the viewing orifice 12 but limiting crosstalk with the adjacent light sources 28 positioned on the substrate 26. Alternatively or additionally, a concave lens or a space may be formed into the optical path 20 right above the optical sensor 32, in order to decrease any crosstalk with adjacent light sources and/or in order to guide the light reflected from the surface 3 of the object 1. The light sources 28 may comprise a plurality of color light emitters, in particular red, green and blue light emitters (RGB) 28$r$, 28$g$, 28$b$, which in advantageous embodiments may be in the form of LEDs (light emitting diodes), OLEDs (organic light emitting diodes), or VCSELs (vertical cavity surface emitting lasers). The aforementioned light emitting sources are per se known in the art and need not be further described herein. At least one color light emitting element is provided below or in the base orifice 16, however in preferred embodiments, a plurality of color light emitting elements (e.g a plurality of LEDs, OLEDs, or VCSELs) are provided in the base orifice 16. The latter allows to optimize the intensity of the emitted light through the viewing orifice 12, and/or alternatively to enable finer control of varying light intensity by switching on and off various light emitters, and/or to enhance the range of colors that may be achieved by controlling the switching on and off of a plurality of different spectrum (e.g. R, G, B) emitters, or for color calibration and measurement purposes.

According to variants, it is also possible as best illustrated in FIG. 3 to have a plurality of optical sensors 32, preferably at least one optical sensor in a center of base orifice 16, and other sensors interspersed in a distributed manner over the base orifice surface area, or arranged proximate edges of the base orifice 16. Each optical sensor may be identical to the other optical sensors or may be different, for instance different optical sensors may have different sensing spectrums. For instance, optical sensors may be configured for light in a visible range, for infrared light, for ultraviolet light, or for any selected portions of the spectrum from infrared to ultraviolet. Optical sensors that measure only light intensity (or light luminance) may also be included.

Non optical sensors positioned below the solid region 18 may comprise in particular a pressure sensor 34$p$, a heat or temperature sensor 34$t$, a capacitive sensor 34$c$ and a magnetic field sensor 34$m$. These sensors 34 may be used to detect various properties of an animate or inanimate object 1 in contact with the viewing surface 10 or in proximity to the viewing surface 10. Two or more sensors of different types may also be used in conjunction to determine a specific property of an animate or inanimate object.

Since the non-optical sensors 34 may positioned in each of the solid regions 18, the spacing and number of which correspond to the spacing and number of optical paths 20, the resolution of the non-optical sensors may be as high as the resolution of the pixels of the display formed by viewing orifices 12, whereby each viewing orifice 12 may advantageously form a pixel of a still or moving image displayed by display 2.

Non-optical sensors 34 may be positioned below each solid region 18 formed between the base orifices 16, however in variants it is also possible to have solid regions 18 without sensors, for instance by providing sensors only every $3^{rd}$ or $4^{th}$ solid region 18 if a lower sensing resolution is provided for certain applications. Also, different solid regions 18 may be provided with different sensors, or may be provided with combinations of sensors. For instance, in the illustrated embodiment, the solid region 18 between base orifices 16 is provided with at least three sensors, including a pressure sensor 34$p$, a heat or temperature sensor 34$t$, and capacitive sensor 34$c$. This plurality of different sensors 34 may be provided combined under each solid region 18 or may be provided as individual sensors, the sensors being arranged in any desired pattern on the substrate 26.

Capacitive sensors may be used to measure an electrical field that is modified by the presence of an object in contact with or in close proximity with the viewing surface 10.

In an embodiment, a capacitive sensor 34c may comprise a first electrode 34c1 connected to a first potential under a first solid region 18-1 and a second electrode connected to a second potential under an adjacent second solid region 18-2. A object in contact with or in close proximity with the viewing surface 10 that alters the electrical field between the first and second electrodes may be detected by electronic circuits connected to the electrodes for measuring the change in potential between electrodes.

Other electrode arrangements are possible within the scope of the invention. For instance, under each solid region 18 an electrode at a first potential may be arranged, surrounded by a dielectric gap (for instance an annular non conductive gap on the substrate 26) from a second electrode in the same or essentially same plane connected to a reference potential such as ground that is common to all capacitive sensors. The electrodes of the capacitive sensors could also be arranged in layers separated by a dielectric material either within the substrate 26 or within the body 9 of the display panel. One or both of the two electrodes, depending on the variant, could be formed at the interface between the substrate 26 and the solid regions 18 of the body 9, either on the surface of the body or on the surface of the substrate.

In yet another variant, one of the electrodes of each capacitive sensor may be positioned in the functional layer 8 or proximate the functional layer 8.

Electrical paths through the body 9 between the functional layer 8 and the sensing and emitting base 6 substrate may be provided by conductive tracks formed for instance during an additive manufacturing process of the display panel 4 or by the conductive surface 38 of each optical path. The electrical paths may be formed between optical paths 20 and serve to interconnect photovoltaic elements and sensing elements on the viewing surface to the substrate 26 or electronic circuits provided below the substrate within the display device. The capacitive sensors may be used to detect any disturbance to the electrical field or by mechanically changing the distance separating complementary electrodes. The resolution of the capacitive sensors, may correspond to the pixel resolution of the display, or to a lower resolution, depending on the distribution of capacitive sensors.

In an embodiment, a pressure sensor may comprise a piezo resistive element on the substrate 26 below the solid region 18 of the display panel body 9. In an embodiment, the piezo element may also be actively controlled as an actuator to vibrate on command or in reaction to a sensed signal, for instance to provide haptic feedback in reaction to a pressure applied on the viewing surface 10. In other embodiments, other pressure sensing elements may be used, for instance a strain gage measuring a deformation due to local pressure transmitted through the body 9 or solid region 18, or through a capacitive sensing technique by measuring a change in the distance separating complementary electrodes.

The non-optical sensors 34 positioned in under the solid region 18 of the display panel 4 thus allow both very localized measurements, up to the resolution of the visual pixel resolution of the display, for wide area sensing or for very local sensing to allow accurate measurement of the properties of animate or inanimate objects in contact with the viewing surface or in proximity to the viewing surface, and to allow accurate discrimination between objects with different properties. As a plurality of sensors 34 may be provided in a solid region 18 combined with an optical sensor 32 in an optical path 20, signals from a plurality of sensors may be combined for high discrimination of the properties of objects, for instance for biometric identification.

In a variant where the body 9 is made of a partially transparent or fully transparent material, the sensors positioned in the solid region may further include optical sensors that may be used to detect various optical properties of an object in proximity or in contact against the viewing surface 10. This may include detecting a visible light spectrum, for instance color, or simply light intensity. In variants, this may also allow detection of infrared through the body 9 by infrared sensors positioned under the solid regions 18 of the body, for instance for use as a proximity or movement sensor by the display, or for receiving commands from an infrared remote control for operation of the display.

The non-optical sensors 34 may be used in conjunction with the optical sensors 32 in the optical path 20 to determine a range of properties regarding the object.

Non-optical sensors may include magnetic field sensors. A magnetic field sensor 34m, which may for instance be a Hall effect sensor or magnetoresistive sensor (which are both per se known in the art) may be used to detect a magnetic field that is either a general magnetic field, such as the Earth's magnetic field for use as a compass or for navigation applications, or a local magnetic field, for instance the presence of an object such as a ferromagnetic or magnetic pointing pen that disturbs the magnetic field at a specific location on the display. The magnetic sensors may thus be used to determine the position of a conductive or magnetic pointing device or pen that is in contact or in proximity with the viewing surface. This also allows various inputs via the pointing device or pen, for instance to enter commands via the display or to capture handwritten text written free hand on the display with the pen.

Pressure sensors and capacitive sensors may similarly also be used to enter commands via the display or to capture handwritten text written free hand on the display with the pen.

The heat or temperature sensors 34t may have different configurations. In an embodiment, the temperature sensor 34t is formed by a circuit trace (not shown) having a resistive material sensitive to temperature changes. The voltage across the resistive circuit trace can be measured to determine the temperature.

The body 9 of the display may advantageously be made of a good thermal conducting material such as a metal that allows the temperature of an object 1 in contact with the viewing surface 10 to transmit via conduction rapidly through the body 9 to the heat sensor 34t positioned under the solid regions 18. Contrary to typical display materials of glass or polymer, the ability to manufacture the display panel in various metals with high thermal conductivity provides the display with rapid and accurate temperature sensing capabilities. Since the display panel body 9 has a very low height H, the thermal capacity of the thin layer, especially if the body material is metallic, is very low and heat will transmit rapidly by conduction. In this regard, it can be used alone or in conjunction with other sensors, for instance for biometric identification by measuring temperature variations over time and geometrically across the surface in contact with for instance a finger placed on the display. The rapid temperature measurement also allows to provide a quick interface for input commands based for instance by contact of a user's finger.

Similar to the non-optical sensors 34 described above, the resolution of the temperature sensors may be equivalent to the visual pixel resolution of the image displayed by the display, or may have a lower resolution by intermittently positioned sensors, depending on the needs of the application.

In view of the high possible resolution of the temperature sensors, temperature sensing can also be used to enhance or fully execute finger print recognition by measuring the differences in temperatures where the ridges of a finger print contact the viewing surface and the grooves therebetween that are not in contact with the viewing surface. Alternatively or in addition, capacitive sensing can be used to measure the ridges in contact with the display. Alternatively or in addition, the optical sensors 32 in the optical paths 20 may also use to optically capture color and light intensity of pixels of the objet surface 3 in contact with the viewing surface 10 to determine the graphical characteristics of the surface. The latter may be used in order to perform a scan of the object surface, either to output an image reproduction of the object surface 3, or to store and compute various optical characteristics of the object surface.

Using two, or even three or more, different measurement techniques, namely an optical and a non-optical measurement, also allows to greatly enhance the biometric identification and in particular to reduce false positives and false negatives. Also, an important advantage is the ability to perform biometric identification simultaneously while the user uses the display to view images or enter commands or to text messages.

According to one aspect of the invention, the multifunctional display 2 has a scanning function. The display may thus operate as a display for displaying still or moving images and as a scanner for scanning the surface of animate or inanimate objects placed against the viewing surface 10, such as documents, photographs, electronic still and moving images on a screen, textiles, and various objects. Objects may further include a person's finger or other body parts, for instance a portion of skin, Applications may include biometric identification, or medical applications, for instance to detect lesions or skin cancer as an example.

Therefore, in one aspect of the invention, the display 2 may function as a color scanner. The color scanner according to this invention is geometrically very accurate in view of the direct contact on the viewing surface and the pixel accuracy defined by the viewing orifices. The color scanner according to this invention is also chromatically very accurate with high contrast, due to the absence of cross talk and ambient light disturbance in the optical paths 20. According to this aspect, the lights sources 28 emit light and that travels along the optical path 20 to the viewing orifice 12 and reflects off the surface 3 of the object 1 placed thereagainst, the reflected light traveling back down the optical path 20 and captured by one or more optical sensors 32.

In a first embodiment, light source elements with different color spectrums, for instance red, green and blue (RGB) light sources 28r, 28g, 28b may be switched on and off in succession, the optical sensor simultaneously reading the color (chrominance) and/or light intensity (luminance) of the light signals reflected from the object's surface 3.

At positions where the object does not overlap a viewing orifice 12, the emitted light signals are not reflected and this situation can also be detected in order to determine the contour and presence of the object surface in contact with the viewing surface 10. The difference between more or less slow ambient light, and the synchronized pulsed light bursts of the light sources can be easily detected.

The successive reflection of light of different color spectrums allows the optical sensor to measure accurately the color of the portion of the surface overlying the corresponding viewing orifice 12, especially since the light resistant optical path blocks out or at least significantly reduces environmental light as well as cross-talk between adjacent optical paths.

In an alternative embodiment, the light of different color spectrums from different light sources 28r, 28g, 28b may be projected simultaneously (e.g. to project white light) whereby the optical sensor 32 is configured to measure the frequency spectrum and intensity of the reflected light in order to determine the color of the object's surface overlying the viewing orifice 12. The frequency of the switching on and off of the light sources may be in a range of 1 to 100 kilohertz for instance which allows the object 1 to be moved across the viewing surface 10 in order to perform a scanning action to prove the measurement accuracy of the scanning if needed. It should however be noted that since the number of pixels defining the resolution of the display may exceed 500 dpi, and in embodiments over 1000 dpi a high resolution scanning function is provided.

An important advantage of the scanning function of the aforementioned display arises from the absence of crosstalk between adjacent optical paths such that very high contrast and measurement accuracy of the colors and contrast can be performed. Moreover, since the light generated by the scanner is emitted through a small overall surface area, a very low power scanning operation can be performed. For the same reasons, the display also allows for displaying still or moving images with lower power compared to conventional displays with glass, sapphire or polymer screen surfaces.

In an embodiment, the optical sensors 32 or non-optical sensor 34 may provide sensing information to a microprocessor of the display to determine the contour of the surface 3 in contact with the viewing surface, such that the microprocessor controlling the light sources 28 during a scanning operation may limit the activation of the light sources to those that are within said contour in order to reduce power consumption.

Figure 4:
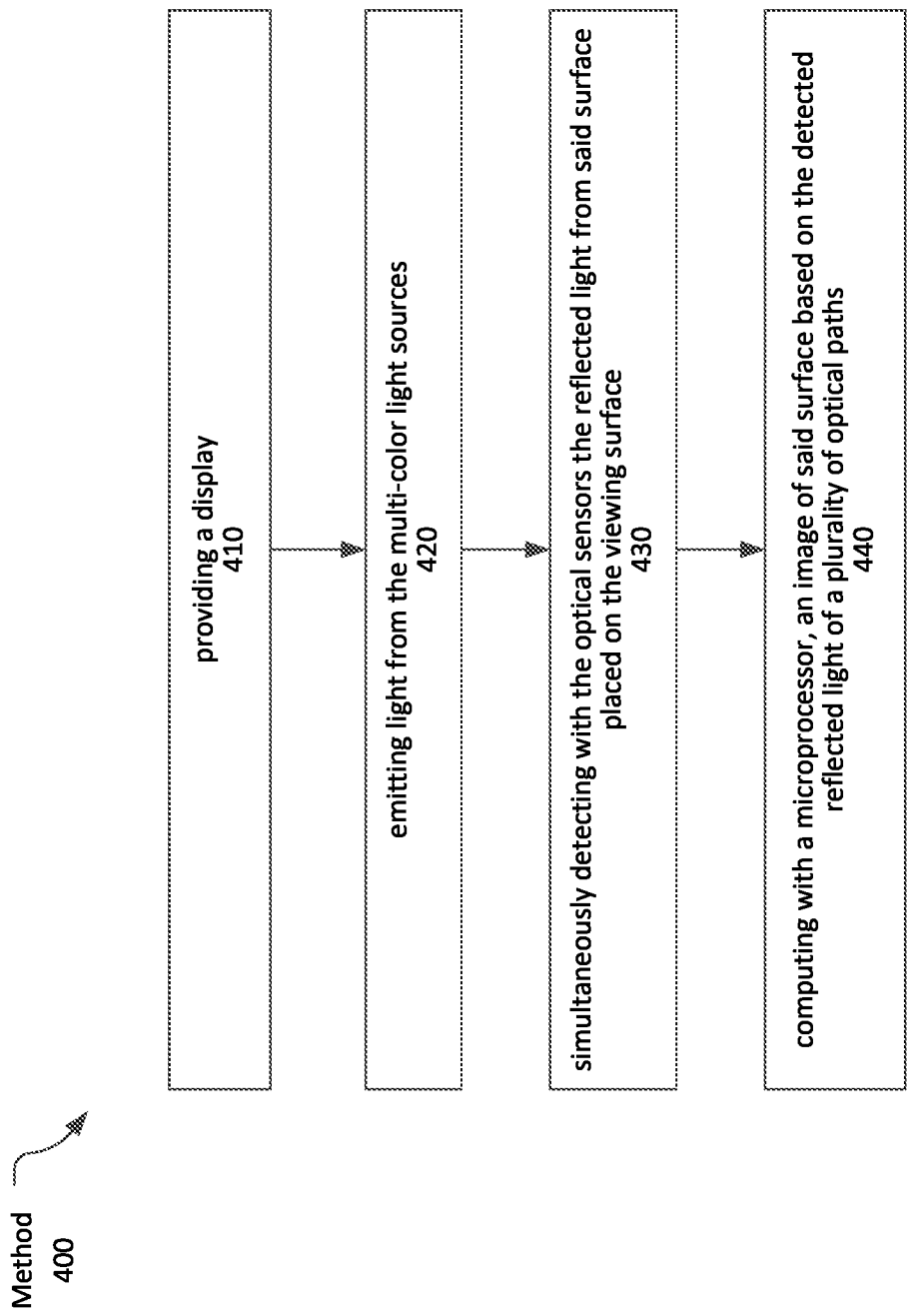
FIG. 4 is a flow diagram of a method of scanning a surface of an object according to an embodiment of the invention.

It may be noted that the viewing surface 10 may advantageously be coated with a hard protective material layer such as a diamond-like carbon (DLC) material or a ceramic material. The viewing surface may further be provided with glossy or mat or even patterned surface finishes, considering that the viewing orifices 12 forming pixels of a displayed or scanned image constitute only a very small portion (less than 5%) of the overall display panel surface area FIG. 4 is a flow diagram of a method 400 of scanning a surface (3) of an object (1) according to an embodiment of the invention. The method 400 of scanning a surface of an object comprises: providing a display according to description herein at 410; emitting light from the multi-color light sources at 420; simultaneously detecting with the optical sensors the reflected light from said surface placed on the viewing surface at 430; and computing with a microprocessor, an image of said surface based on the detected reflected light of a plurality of optical paths at 440.

LIST OF REFERENCES USED

Objet 1
   Detected surface 3
Display 2
   Display panel 4
      Body 9
      Functional layer 8
      Viewing surface 10
         Viewing orifice 12
      Base surface 14

Base Orifice 16
Solid region 18
  center section 36
Optical path 20 (light channel)
  Light concentrator 22
    Boundary layer 38
      Guide layer
  Light guide 24
  Lens 25
  Exit diffuser 27
Sensing and emitting base 6
  Substrate 26
  Light source 28 (RGB)
    LED, OLED, VCSELL
    Red light emitter 28r
    green light emitter 28g
    blue light emitter 28b
  Sensors 30
    optical sensors 32
      RGB, Infrared, . . .
    Object properties and presence sensors 34
      Pressure sensor
      Heat sensor
        Temperature sensor
      Electrical field sensor
      Magnetic field sensor
      Contact sensor
      Proximity sensor
Viewing orifice diameter DO
Base orifice diameter DB
Distance between orifices L
Display panel height H

The invention claimed is:

1. A multifunctional display comprising a display panel and a sensing and emitting base, the display panel comprising a body forming a layer extending substantially between a viewing surface that an observer can see, or against which an object may be placed, and a base surface facing the sensing and emitting base, and a plurality of optical paths-bounded by a light resistant material are formed within the body extending between a base orifice in the base surface and a viewing orifice in the viewing surface for the passage of light between base orifice and the viewing orifice, the sensing and emitting base comprising at least one multi-color light source positioned below or in the base orifice and at least one optical sensor positioned below or in the base orifice, wherein the display comprises a scanning function in which the sensing and emitting base is operable to emit light from the multi-color light source and simultaneously detect with the optical sensor reflected light of the emitted light from a surface of an object placed on the viewing surface, and to compute with a microprocessor, an image of said surface of the object based on the detected reflected light of a plurality of optical paths.

2. The display according to claim 1 wherein said image is processed as an output for a visual reproduction of the scanned surface, or as a characterization of the object.

3. The display according to claim 1, wherein a diameter (DO) of the viewing orifice is in a range of 1 μm to 25 μm and a distance (L) between adjacent viewing orifices is in a range of 25 μm to 200 μm, and a diameter (DB) of the base orifice is in a range of 20 μm to 150 μm.

4. The display according to claim 1, wherein in the scanning function, the sensing and emitting base is operable, for each optical path, to successively emit light from the multi-color light source at different colors and successively detect with the optical sensor the reflected light, whereby the microprocessor computes from a combination of the successively detected reflected light, at least a light intensity of the scanned surface for each optical path.

5. The display according to claim 1, further comprising non-optical sensors, each arranged under a solid region of the display panel between optical paths.

6. The display according to claim 5, wherein a density and resolution of non-optical sensors corresponds to one of at least 10% of a density and resolution of optical paths, at least 25% of the density and resolution of optical paths, or at least 50% to 100% of the density and resolution of optical paths.

7. The display according to claim 6, wherein the non-optical sensors include any one or more of a pressure sensor, a thermal sensor, a capacitive sensor, and a magnetic field sensor.

8. The display according to claim 6, wherein the non-optical sensors include a capacitive sensor that comprises first and second electrodes arranged in, or substantially in, a same plane parallel to the viewing surface.

9. The display according to claim 5, wherein the non-optical sensors comprise a piezo electric element for pressure sensing, and wherein the piezo-electric element is connected to a control system arranged to activate the piezo electric element as a haptic actuator, or as a sound generator, or as a vibration generator.

10. The display according to claim 5, wherein the non-optical sensors are positioned on a substrate of the sensing and emitting base.

11. The display according to claim 1, wherein the body of the display panel is made of a light resistant material, or alternatively the body of the display panel is made of a transparent or partially transparent material for visible and/or infrared light, whereby the optical paths comprise a light resistant boundary layer.

12. A method of scanning a surface of an object comprising:
   a. providing a display according to claim 1;
   b. emitting light from the multi-color light sources and simultaneously detecting with the optical sensors the reflected light from said surface placed on the viewing surface;
   c. computing with the microprocessor, an image of said surface based on the detected reflected light of a plurality of optical paths.

13. The method according to claim 12, wherein, for each optical path, the method comprising successively emitting light from the multi-color light source at different colors and successively detecting with the optical sensor the reflected light, whereby the microprocessor computes from a combination of the successively detected reflected light, at least a light intensity of the scanned surface for each optical path.

14. The method according to claim 12, wherein, for each optical path, the method comprising emitting white light from the multi-color light source and simultaneously detecting with the optical sensor at least a color spectrum and intensity of the reflected light for each optical path.

15. The method according to claim 12, further comprising determining the contour of the surface in contact with the viewing surface and limiting the activation of the light sources to those that are within said contour in order to reduce power consumption.

* * * * *